(12) United States Patent
Shibuya et al.

(10) Patent No.: US 6,995,578 B2
(45) Date of Patent: Feb. 7, 2006

(54) COUPLING UNIT, TEST HEAD, AND TEST APPARATUS

(75) Inventors: Atsunori Shibuya, Tokyo (JP); Masashi Hoshino, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/881,175

(22) Filed: Jun. 30, 2004

(65) Prior Publication Data

US 2004/0232930 A1  Nov. 25, 2004

Related U.S. Application Data

(63) Continuation of application No. PCT/JP2004/004769, filed on Apr. 1, 2004.

(30) Foreign Application Priority Data

Apr. 4, 2003 (JP) .............................. 2003-101351

(51) Int. Cl.
*G01R 31/02* (2006.01)

(52) U.S. Cl. .................................. 324/754; 324/158.1
(58) Field of Classification Search ........ 361/774–775, 361/679, 731, 736, 748; 324/754, 158.1, 324/765
See application file for complete search history.

(56) References Cited

U.S. PATENT DOCUMENTS

| 4,758,780 A | * | 7/1988 | Coon et al. ................. 324/73.1 |
| 4,986,778 A | * | 1/1991 | Liken et al. .................... 439/74 |
| 5,051,689 A | * | 9/1991 | Hiwada et al. ............. 324/754 |
| 5,103,378 A | * | 4/1992 | Stowers et al. ............. 361/802 |
| 5,754,057 A | * | 5/1998 | Hama et al. ................. 324/754 |
| 5,793,218 A | * | 8/1998 | Oster et al. ................. 324/754 |
| 5,986,458 A | * | 11/1999 | Saito et al. ................. 324/754 |
| 6,747,447 B2 | * | 6/2004 | Markert et al. .......... 324/158.1 |

FOREIGN PATENT DOCUMENTS

| JP | 7-6776 | 1/1995 |
| JP | 11-30644 | 2/1999 |

OTHER PUBLICATIONS

International Search Report dated Jul. 13, 2004 (1 page).

* cited by examiner

*Primary Examiner*—Paresh Patel
(74) *Attorney, Agent, or Firm*—Osha Liang LLP

(57) ABSTRACT

A coupling unit for electrically coupling a performance board on which an electronic device is mounted and a tester control unit for generating a control signal for controlling a test of the electronic device includes a board containing unit for containing a test board electrically coupled to the tester control unit in order that the test board is replaceable on one of a plurality of different holding positions and a coupling cable whose one end is coupled to the test board held in the holding position and the other end is coupled to the performance board.

33 Claims, 3 Drawing Sheets

COUPLING UNIT, TEST HEAD, AND TEST APPARATUS

The present patent application is a continuation application of PCT/JP2004/004769 filed on Apr. 1, 2004 which claims priority from a Japanese patent application No. 2003-101351 filed on Apr. 4, 2003, the contents of which are incorporated herein by reference.

BACKGROUND OF THE INVENTION

1. Field of the Invention

The present invention relates to a coupling unit, a test head and a test apparatus. More particularly, the present invention relates to a coupling unit, a test head and a test apparatus capable of containing test boards efficiently.

2. Description of the Related Art

A semiconductor test apparatus tests an electronic device using a board on which an electric circuit used for the test is mounted. The board is contained in, e.g. a test head.

However, the height of the electric circuit mounted on the board might vary depending upon the test. Accordingly, the board cannot be contained efficiently in the prior art.

SUMMARY OF THE INVENTION

Therefore, it is an object of the present invention to provide a coupling unit, a test head and a test apparatus, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a coupling unit for electrically coupling a performance board on which an electronic device is mounted and a tester control unit for generating a control signal for controlling a test of the electronic device includes a board containing unit for containing a test board electrically coupled to the tester control unit in order that the test board is replaceable on one of a plurality of different holding positions and a coupling cable of which one end is coupled to the test board held in the holding position and the other end is coupled to the performance board.

The coupling unit may further include a holding member fixed to be replaceable on one of a plurality of different fixing positions of the board containing unit, for holding the test board on one of the holding positions in response to the fixing position.

The coupling unit may further include a control unit cable of which one end is coupled to the test board held in the holding position and the other end is coupled to the tester control unit.

The coupling unit may further include a guide member detachably disposed on an installation position in response to the fixing position on which the holding member is fixed, for guiding a side of the test board when the test board is being inserted into the board containing unit.

The board containing unit may have a plurality of holes formed in a row in response to each of the fixing positions on a surface thereof to which the holding member is attached, and the holding member includes a projection for engagement with one of the holes.

The board containing unit may contain a plurality of the test boards, and the coupling unit may further include an inter-board cable whose both ends are coupled to the different test boards, respectively.

The board containing unit may contain a plurality of the test boards, and the coupling unit may further include a coupling board coupled to the test boards.

The coupling unit may further include a control unit cable of which one end is coupled to the test board and the other end is coupled to the tester control unit, wherein the coupling board may be electrically coupled to the test boards and the control unit cable.

According to the second aspect of the present invention, a test head for detachably fixing a test board electrically coupled to a tester control unit for generating a control signal for controlling a test of the electronic device includes a board containing unit for containing the test board to be replaceable on one of a plurality of different holding positions, a holding member, which is fixed to be replaceable on one of a plurality of different fixing positions of the board containing unit, for holding the test board on one of the holding positions in response to the fixing position, and a control unit cable of which one end is coupled to the test board held in the holding position and the other end is coupled to the tester control unit.

According to the third aspect of the present invention, a test apparatus for testing an electronic device includes a tester control unit for generating a control signal for controlling a test of the electronic device, a test board electrically coupled to the tester control unit, a board containing unit for containing the test board electrically coupled to the tester control unit in order that the test board is replaceable on one of a plurality of different holding positions, a holding member, which is fixed to be replaceable on one of a plurality of different fixing positions of the board containing unit, for holding the test board on one of the holding positions in response to the fixing position, and a coupling cable of which one end is coupled to the test board held in the holding position and the other end is coupled to the performance board.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
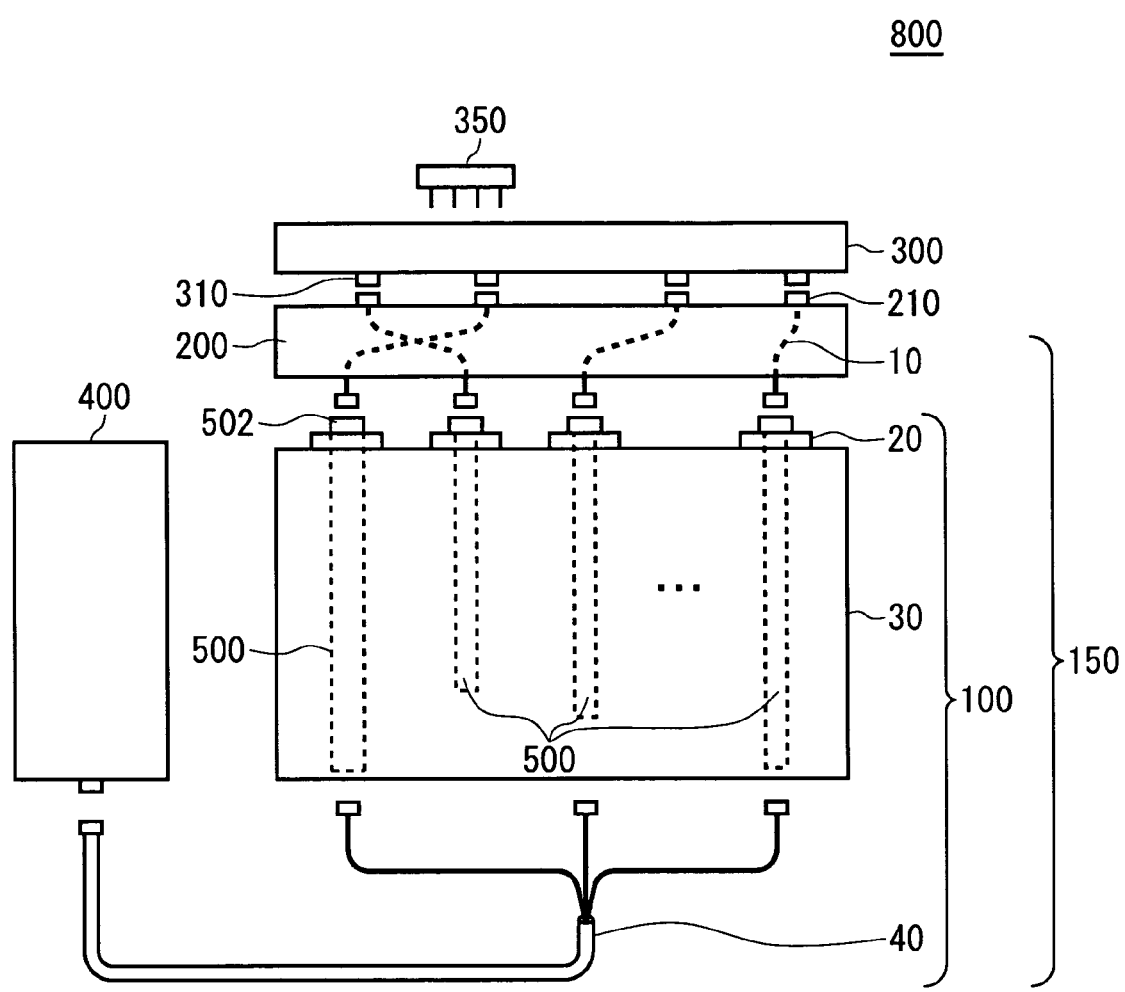
FIG. 1 shows an example of the configuration of a test apparatus 800 of this embodiment.

FIG. 1 shows an example of the configuration of a test apparatus 800 of this embodiment. The test apparatus 800 which is an apparatus for the test of an electronic device 350 includes a tester control unit 400, a performance board 300, a coupling unit 150, and a plurality of test boards 500. The electronic device 350 is an object of the test (DUT: Device Under Test) such as a semiconductor device. The tester control unit 400 generates a control signal for the test of the electronic device 350, and supplies it to the test boards 500.

The performance board 300 includes a plurality of connectors 310 provided on its bottom surface facing the coupling unit 150. And the performance board 300 mounts the electronic device 350 which is electrically coupled to at least a few of the connectors 310 on its top surface. The connectors 310 are electrically coupled to the coupling unit 150. Accordingly, the performance board 300 electrically couples the electronic device 350 and the coupling unit 150. Further, the performance board 300 may mount a plurality of electronic devices 350. In addition, the performance board 300 may include, e.g. gold pads which are electrically coupled to the coupling unit 150 in place of the connectors 310.

The coupling unit 150 includes a hifix 200 and a test head 100. The hifix 200 includes a plurality of connectors 210 and a plurality of coupling cables 10. Each of the connectors 210 is provided in response to each of the connectors 310 of the performance board 300, and coupled to each of the corresponding connectors 310. Further, the hifix 200 may include a pogo pin assembly which is electrically coupled to the connectors 310 in place of the connectors 210.

And one end of each of the coupling cables 10 is designed to have a degree of freedom to be wired facing the test head 100, and coupled to the top of each of the test boards 500. The other end of each of the coupling cables 10 is coupled to each of the connectors 210. Accordingly, the hifix 200 electrically couples the performance board 300 and the test boards 500.

The test head 100 includes holding members 20, a board containing unit 30, and a control unit cable 40. The holding members 20 are fixed to be replaceable on any of fixing positions of the board containing unit 30. The holding members 20 hold the test boards 500 on predetermined holding positions in response to the fixing positions. And the board containing unit 30 is a case for containing the plurality of test boards 500.

Each of one ends of the control unit cable 40 which has a degree of freedom is wired to the board containing unit 30, and coupled to the bottom of each of the test boards 500. The other end of the control unit cable 40 is coupled to the tester control unit 400. Accordingly, the control unit cable 40 couples the test boards 500 and the tester control unit 400. In addition, the coupling unit 150 electrically couples the performance board 300 and the tester control unit 400.

Each of the test boards 500 which is a board such as a pin card where an electric circuit used for the test of the electronic device 350 is mounted is detachably contained in the test head 100. Each of the test boards 500 may be a test module on which, e.g. a pin electronics or power supply unit is mounted.

Here, if the tester control unit 400 and the test boards 500 are fixed via a board (backboard) including connectors provided in response to the test boards 500 respectively, the test head 100 necessarily contains each of the test boards 500 on the corresponding positions of the connectors. In this case, however, since the positions on which the test boards 500 should be contained are determined by the positions of the connectors, the degree of freedom for the disposition of the test boards 500 might be decreased.

In this embodiment, however, the test boards 500 are coupled to the tester control unit 400 via the control unit cable 40 whose one ends have the degree of freedom for wiring. Accordingly, in this embodiment, the test boards 500 can be disposed with a high degree of freedom. In addition, the other end of the control unit cable 40 has a degree of freedom in a height direction facing from the bottom to the top of the test head 100. Accordingly, the test head 100 can contain the test boards 500 whose lengths are different from each other in the height direction.

Figure 2:
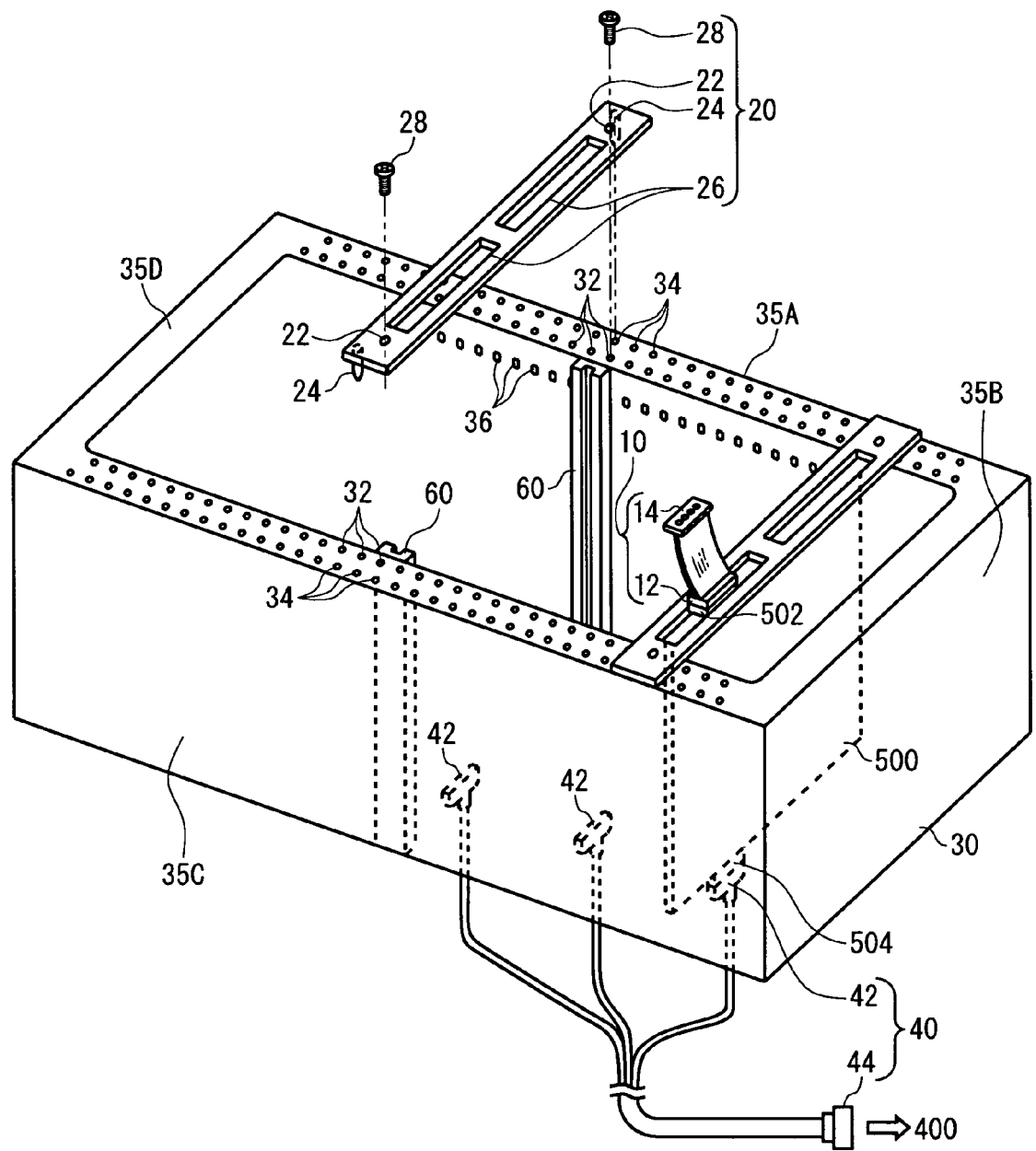
FIG. 2 shows an exploded perspective view of an example of the configuration of a test head 100.

FIG. 2 shows an exploded perspective view of an example of the configuration of the test head 100. The test head 100 includes a board containing unit 30, guide members 60 and a control unit cable 40.

The board containing unit 30 contains the plurality of test boards 500 in a space between wall members 35A and 35C which are parts of a case consisting of four vertically plate-shaped wall members 35A to 35D surrounding four directions. The wall members 35A and 35C are disposed approximately in parallel facing each other with a predetermined space between them. The four wall members 35A and 35D are integrally formed to match the levels of their top surfaces with each other.

In addition, the board containing unit 30 has a plurality of positioning holes 34, a plurality of screw holes 32, and a plurality of guide member fixing holes 36. The positioning holes 34 are formed on the top surfaces of both of the wall members 35A and 35C in a row at approximately regular intervals in the direction perpendicular to the direction from the wall member 35A towards the wall member 35C. Accordingly, the positioning holes 34 determine the fixing positions of the holding members 20 respectively.

The screw holes 32 are formed in a row adjacent to the positioning holes 34 respectively. The screw holes 32 are used for fixing the holding members 20.

The guide member fixing holes 36 are formed on both a surface of the wall member 35A facing the wall member 35C and a surface of the wall member 35C facing the wall member 35A in a row parallel to the arrangement direction of the positioning holes 34 in response to the positioning holes 34 respectively. The guide member fixing holes 36 detachably fix the guide members 60 by engaging parts of the guide members 60. Accordingly, the guide members 60 are detachably provided on predetermined positions in response to the fixing positions where the holding members 20 are fixed.

The holding member 20 is a stick-shaped body whose length in its longitudinal direction is longer than the distance between the wall members 35A and 35C, and holds the top of the test board 500. Each of the holding members 20 includes two fixing screws 28, and has two projection sections 24, two penetration holes 22, and a plurality of connector fixing holes 26.

Each of the two projection sections 24 is a positioning pin which projects approximately right downwards from the bottom surface of the holding members 20. One of the two projection sections 24 is engaged with the positioning hole 34 of the wall member 35A, whereas the other projection section 24 is engaged with the positioning hole 34 of the wall member 35C.

In this case, the fixing positions of the holding members 20 can be determined in order that the interval of the positioning holes 34 becomes the minimum unit of positioning. Accordingly, the holding members 20 can be disposed on the board containing unit 30 with high precision.

The penetration holes 22 are formed penetrating the holding member 20 from the top surface to the bottom surface thereof. The fixing screws 28 fix the holding member 20 by engaging the screw holes 32 through the penetration holes 22. Accordingly, the holding members 20 are fixed to be replaceable on any of the fixing positions of the board containing unit 30. The connector fixing holes 26 are formed penetrating the holding member 20 from the top surface to the bottom surface thereof in response to top connectors 502 provided on the top of the test board 500. The connector fixing hole 26 interposes and fixes the top connector 502 and the connector 12 provided at the one end of the coupling cable 10 facing the top connector 502.

Accordingly, in this embodiment, since the holding members 20 hold the connectors coupled to the test boards 500, they hold the test boards 500 indirectly. Alternatively, the holding members 20 may directly hold the test boards 500.

Each of the guide members 60 is a pillar-shaped member having a groove which extends in its longitudinal direction. The guide member 60 has a projection not shown for engagement into the guide member fixing hole 36, and engages the projection into the guide member fixing hole 36, so that it is detachably installed on the position where the guide member fixing hole 36 is formed. And the two guide members 60 are disposed facing their grooves each other on the wall members 35A and 35C respectively. Accordingly, the two guide members 60 guide the two opposite sides of the test board 500 being inserted downwards into the board containing unit 30 respectively.

Accordingly, since the guide members 60 are installed in advance in the board containing unit 30, the test boards 500 can be inserted into the positions where they should be inserted without any mistake. Therefore, in this embodiment, the test boards 500 can be contained in the board containing unit 30 properly.

Further, each of the test boards 500 is coupled to the coupling cable 10 and the control unit cable 40 via the top and bottom connectors 502 and 504 provided on its top and bottom respectively. The one end of the control unit cable 40 branches in response to a plurality of connectors 42 and the branches are coupled to the corresponding connectors 42 respectively, whereas the other end of the control unit cable 40 is coupled to the tester control unit 400 via a connector 44. And the coupling cables 10 are such cables that a plurality of coaxial cables are tied up, and coupled to the top connectors 502 and the connectors 210 (cf. FIG. 1) via their connectors 12 and 14 provided at their one and other ends respectively.

Figure 3:
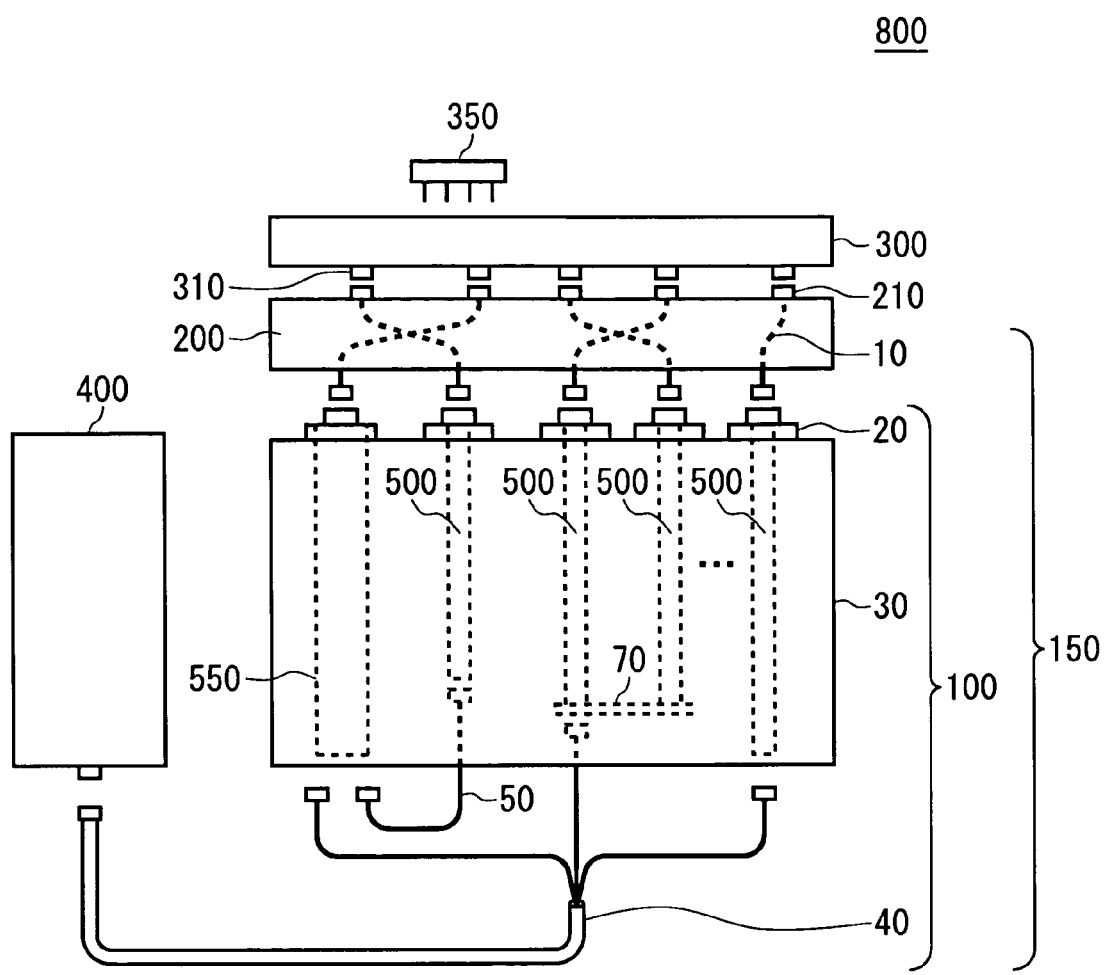
FIG. 3 shows another example of the configuration of the test apparatus 800.

FIG. 3 shows another example of the configuration of the test apparatus 800. In this embodiment, the test apparatus 800 further includes an interface board 550. And the test head 100 further includes an inter-board cable 50 and a coupling board 70.

The interface board 550 is a test board for generating a signal to be supplied to other test boards 500, and coupled to the one end of the control unit cable 40 and the one end of the inter-board cable 50.

Both ends of the inter-board cable 50 are coupled to the interface board 550 and the test board 500 respectively. Accordingly, the inter-board cable 50 electrically couples the interface board 550 and the test board 500. In addition, the interface board 550 is electrically coupled to the tester control unit 400 and the test boards 500. Accordingly, since the test board 500 and the interface board 550 are coupled via the inter-board cable 50, wiring of the control unit cable 40 can be simplified. Further, both ends of the inter-board cable 50 may be coupled to the different test boards 500 respectively.

The coupling board 70 is coupled to each of the test boards 500 on its top surface and to the one end of the control unit cable 40 on its bottom surface. Accordingly, the coupling board 70 electrically couples the plurality of test boards 500 and the control unit cable 40. In further another embodiment, the coupling board 70 may be coupled to the interface board 550 and the test boards 500. In addition, the test head 100 may include a plurality of coupling boards 70, and in this case each of the coupling boards 70 may be coupled to each other via the inter-board cables 50.

Here, the interface board 550 may further have a part of the function of the tester control unit 400 described in connection with FIG. 1. For example, the interface board 550 may have the functions of a test vector generator, a timing generator, a failure analysis memory, a format control, etc. Accordingly, the tester control unit 400 can be packed more closely.

In addition, the interface board 550 may generate a part of the control signal for the control of the test of the electronic device 350. In this case, the transmission distance of the control signal transmitted to the performance board 300 can be short. Accordingly, the noise related to the control signal can be reduced, and the test of the electronic device 350 can be more properly performed. Further, except as described above, matters in FIG. 3 given the same symbols as those in FIG. 1 have the same or similar configuration with that in FIG. 1, so they will not be described.

As obvious from the description above, according to the present invention, it is possible to provide a coupling unit, a test head and a test apparatus capable of containing the test boards efficiently.

Although the present invention has been described by way of exemplary embodiments, it should be understood that those skilled in the art might make many changes and substitutions without departing from the spirit and the scope of the present invention which is defined only by the appended claims.

What is claimed is:

1. A coupling unit for electrically coupling a performance board on which an electronic device is mounted and a tester control unit for generating a control signal for controlling a test of said electronic device, comprising:
   a board containing unit for containing a test board electrically coupled to said tester control unit such that said test board is replaceable in one of a plurality of holding positions;
   a coupling cable whose one end is coupled to said test board held in said one of said plurality of holding positions and another end is coupled to said performance board; and
   a holding member, detachably fastened to said board containing unit on one of a plurality of fixing positions of said board containing unit and detachably fastened to said test board, configured to hold said test board in said one of said plurality of holding positions that is determined by said one of said plurality of fixing positions.

2. A coupling unit as claimed in claim 1, further comprising a control unit cable whose one end is coupled to said test board held in said one of said plurality of holding positions and the other end is coupled to said tester control unit.

3. A coupling unit as claimed in claim 1, further comprising a guide member detachably disposed on an installation position of said board containing unit in response to said one of said plurality of fixing positions on which said holding member is fixed, for guiding a side of said test board when said test board is inserted into said one of said plurality of holding positions of said board containing unit.

4. A coupling unit as claimed in claim 1, wherein said board containing unit has a plurality of holes formed in a row in response to each of said plurality of fixing positions on a surface thereof to which said holding member is attached, and said holding member comprises a projection for engagement with one of said holes.

5. A coupling unit as claimed in claim 1, wherein said board containing unit contains a plurality of said test boards, and said coupling unit further comprises an inter-board cable of which both ends are coupled to said different test boards, respectively.

6. A coupling unit as claimed in claim 1, wherein said board containing unit contains a plurality of said test boards, and said coupling unit further comprises a coupling board coupled to said test boards.

7. A coupling unit as claimed in claim 6, further comprising a control unit cable of which one end is coupled to said test board and the other end is coupled to said tester control unit, wherein said coupling board is electrically coupled to said test boards and said control unit cable.

8. The coupling unit of claim 1, wherein a first end of the test board is connected to the holding member and a second end of the test board is connected to a control unit cable.

9. The coupling unit of claim 8, wherein the first end of the test board is located near the electronic device.

10. The coupling unit of claim 1, wherein the holding member is fixed on an upper surface of the board containing unit with a fixing screw.

11. The coupling unit of claim 10, wherein the holding member is positioned on the upper surface of the board containing unit with a positioning pin.

12. The coupling unit of claim 11, wherein the positioning pin is located on an outer side of the board containing unit.

13. The coupling unit of claim 1, wherein the holding member is positioned on an upper surface of the board containing unit with a positioning pin.

14. The coupling unit of claim 1, wherein the test board is held by a guide member.

15. The coupling unit of claim 14, wherein the guide member comprises a groove.

16. A test head for detachably fixing a test board electrically coupled to a tester control unit for generating a control signal for controlling a test of an electronic device, comprising:
a board containing unit for containing said test board to be replaceable in one of a plurality of holding positions;
a holding member, detachably fastened to said board containing unit on one of a plurality of fixing positions of said board containing unit and detachably fastened to said test board, configured to hold said test board in said one of said plurality of holding positions that is determined by said one of said plurality of fixing positions; and
a control unit cable of which one end is coupled to said test board held in said one of said plurality of holding positions and another end is coupled to said tester control unit.

17. The test head of claim 16, wherein a first end of the test board is connected to the holding member and a second end of the test board is connected to the control unit cable.

18. The test head of claim 17, wherein the first end of the test board is located near the electronic device.

19. The test head of claim 16, wherein the holding member is fixed on an upper surface of the board containing unit with a fixing screw.

20. The test head of claim 19, wherein the holding member is positioned on the upper surface of the board containing unit with a positioning pin.

21. The test head of claim 20, wherein the positioning pin is located on an outer side of the board containing unit.

22. The test head of claim 16, wherein the holding member is positioned on an upper surface of the board containing unit with a positioning pin.

23. The test head of claim 16, wherein the test board is held by a guide member.

24. The test head of claim 23, wherein the guide member comprises a groove.

25. A test apparatus for testing an electronic device, comprising:
a tester control unit for generating a control signal for controlling a test of said electronic device;
a test board electrically coupled to said tester control unit;
a board containing unit for containing said test board electrically coupled to said tester control unit such that said test board is replaceable on one of a plurality of holding positions;
a holding member, detachably fastened to said board containing unit on one of a plurality of fixing positions of said board containing unit and detachably fastened to said test board, configured to hold said test board in said one of said plurality of holding positions that is determined by said one of said plurality of fixing positions; and
a coupling cable of which one end is coupled to said test board held in said one of said plurality of holding positions and another end is coupled to said performance board.

26. The test apparatus of claim 25, wherein a first end of the test board is connected to the holding member and a second end of the test board is connected to a control unit cable.

27. The test apparatus of claim 26, wherein the first end of the test board is located near the electronic device.

28. The test apparatus of claim 25, wherein the holding member is fixed on an upper surface of the board containing unit with a fixing screw.

29. The test apparatus of claim 28, wherein the holding member is positioned on the upper surface of the board containing unit with a positioning pin.

30. The test apparatus of claim 29, wherein the positioning pin is located on an outer side of the board containing unit.

31. The test apparatus of claim 25, wherein the holding member is positioned on an upper surface of the board containing unit with a positioning pin.

32. The test apparatus of claim 25, wherein the test board is held by a guide member.

33. The test head of claim 32, wherein the guide member comprises a groove.

* * * * *